(12) United States Patent
Shi

(10) Patent No.: US 12,418,607 B2
(45) Date of Patent: Sep. 16, 2025

(54) INPUT STRUCTURE AND ELECTRONIC DEVICE

(71) Applicant: GUANGDONG OPPO MOBILE TELECOMMUNICATIONS CORP., LTD., Guangdong (CN)

(72) Inventor: Ming Shi, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 446 days.

(21) Appl. No.: 18/148,424

(22) Filed: Dec. 29, 2022

(65) Prior Publication Data

US 2023/0216944 A1 Jul. 6, 2023

Related U.S. Application Data

(63) Continuation of application No. PCT/CN2021/113880, filed on Aug. 20, 2021.

(30) Foreign Application Priority Data

Aug. 31, 2020 (CN) .......................... 202010899940.4

(51) Int. Cl.
 *H04M 1/23* (2006.01)
 *H04M 1/02* (2006.01)
 *H04M 3/62* (2006.01)

(52) U.S. Cl.
 CPC ............. *H04M 1/23* (2013.01); *H04M 1/026* (2013.01)

(58) Field of Classification Search
 CPC ........ H04M 1/23; H04M 1/026; H04M 1/236; H04M 1/233; H04M 1/2472; H04M 3/62;
 (Continued)

(56) References Cited

U.S. PATENT DOCUMENTS 6,965,085 B1 * 11/2005 Orrico ................ H01H 11/0006
 200/61.45 M
9,620,312 B2 * 4/2017 Ely .......................... G06F 1/163
(Continued)

FOREIGN PATENT DOCUMENTS

CN 103367012 B 10/2013
CN 107706031 A 2/2018
(Continued)

OTHER PUBLICATIONS

WIPO, International Search Report for International Application No. PCT/CN2021/113880, Mar. 31, 2022.
(Continued)

*Primary Examiner* — Andrew Wendell
(74) *Attorney, Agent, or Firm* — Hodgson Russ LLP

(57) ABSTRACT

The input structure comprises a base, an operating member, an elastic positioning assembly, and a detection assembly. The operating member is movably arranged on one side of the base. The elastic positioning assembly is arranged on another side of the base away from the operating member. At least two positioning portions are arranged on an end face of the operating member close to the elastic positioning assembly. The positioning portions cooperate with the elastic positioning assembly to position the operating member. The detection assembly is configured to detect position variation of the operating member, and generate a corresponding trigger signal. The electronic device comprises the input structure.

19 Claims, 7 Drawing Sheets

(58) Field of Classification Search
CPC ........ H04B 1/03; H04B 1/08; H03K 17/9505; H03K 17/9517; H03K 2017/9713; H03K 17/97; H01H 3/50; H01H 15/10
See application file for complete search history.

(56) References Cited

U.S. PATENT DOCUMENTS

| | | | | |
|---|---|---|---|---|
| 2002/0041784 | A1* | 4/2002 | Thomas | H04M 1/23 400/489 |
| 2007/0051603 | A1* | 3/2007 | Hakunti | H04M 1/23 200/310 |
| 2009/0229958 | A1* | 9/2009 | Koizumi | H01H 13/58 200/327 |
| 2009/0242375 | A1* | 10/2009 | Kim | H04M 1/23 200/343 |
| 2014/0354070 | A1* | 12/2014 | Watanabe | H03K 17/9525 307/104 |
| 2016/0086456 | A1* | 3/2016 | Wittenberg | H01H 9/161 455/566 |
| 2016/0239054 | A1* | 8/2016 | Peng | G06F 1/1684 |
| 2018/0239385 | A1* | 8/2018 | Mizukami | F16D 65/186 |
| 2019/0379377 | A1* | 12/2019 | Ju | H03K 17/97 |

FOREIGN PATENT DOCUMENTS

| | | |
|---|---|---|
| CN | 207319977 U | 5/2018 |
| CN | 108206109 | 6/2018 |
| CN | 108390983 A | 8/2018 |
| CN | 207925380 | 9/2018 |
| CN | 109192593 A | 1/2019 |
| CN | 208570437 U | 3/2019 |
| CN | 109782988 A | 5/2019 |
| CN | 110149438 A | 8/2019 |
| CN | 110634699 A | 12/2019 |
| CN | 214336606 U | 10/2021 |

OTHER PUBLICATIONS

CNIPA, First Office Action for CN Application No. 202010899940.4, Apr. 28, 2022.
CNIPA, Second Office Action for CN Application No. 202010899940.4, Aug. 12, 2022.
CNIPA, Rejection Decision for CN Application No. 202010899940.4, Nov. 2, 2022.
EPO, Extended European Search Report for EP Application No. 21860289.4, Feb. 5, 2024.

* cited by examiner

INPUT STRUCTURE AND ELECTRONIC DEVICE

CROSS-REFERENCE TO RELATED APPLICATIONS

The present application is a continuation of International Patent Application No. PCT/CN2021/113880, filed on Aug. 20, 2021, which claims priority to Chinese Patent Application No. 202010899940.4, filed on Aug. 31, 2020, the entire disclosures of which are incorporated by reference herein.

TECHNICAL FIELD

The present disclosure relates to the technical field of electronic devices, in particular to an input structure and an electronic device.

BACKGROUND

A consumer electronic device is tending to be intelligent and multi-functional, and the switching of some functions may be realized by pressing keys.

The keys of the related art are pressing type keys, and the pressing type keys can only achieve single function switching operation. When it is necessary to perform multi-function switching operation by pressing keys, more keys are arranged as requirements correspondingly. However, a plurality of keys may occupy large space in an electronic device, making a structure and an installation of electronic device more complex, and affecting an appearance of the electronic device. For example, the design of a mobile phone at present is becoming thinner and lighter. The pressing type keys arranged on a side surface of the mobile phone are prone to failure when the pressing type keys are used for many times. Moreover, the plurality of pressing type keys may take up a large space, and the operation is monotonous, resulting in poor user experience.

SUMMARY OF THE DISCLOSURE

According to an aspect of the present disclosure, an input structure is provided. The input structure includes: a base, an operating member, an elastic positioning assembly, and a detection assembly. The operating member is movably arranged on one side of the base. The elastic positioning assembly is arranged on another side of the base away from the operating member. At least two positioning portions are arranged on an end surface of the operating member close to the elastic positioning assembly, the positioning portions cooperate with the elastic positioning assembly to position the operating member. The detection assembly is configured to detect position variation of the operating member and generate a corresponding trigger signal.

In some embodiments, the at least two positioning portions are arranged in a straight line on the end surface of the operating member. In response to the operating member sliding relative to the base, the elastic positioning assembly generates elastic deformation and moves from one of the positioning portions to another one of the positioning portions.

In some embodiments, a plurality of positioning portions are arranged in a circular shape around a central axis of the operating member. In response to the operating member rotating relative to the base, the elastic positioning assembly generates elastic deformation and moves from one of the positioning portions to another one of the positioning portions.

In some embodiments, the input structure further includes a first locking member. The first locking member is inserted into the base and connected with the operating member by insertion. The first locking member is configured to limit an end of the operating member provided with the positioning portions in the base.

In some embodiments, an end of the operating member close to the positioning portions is further provided with a pair of first insertion portions opposite to each other, and the two first insertion portions are respectively arranged on both sides of the operating member. The first locking member is provided with two second insertion portions opposite to each other, and the two second insertion portions correspond to the two first insertion portions in one-to-one correspondence. In response to the first locking member being connected with the operating member by insertion, the two first insertion portions are respectively fitted with the second insertion portions on corresponding sides thereof in one-to-one correspondence.

In some embodiments, the input structure further includes a fixing mount. The fixing mount is arranged on one side of the base away from the operating member. The elastic positioning assembly is disposed in the fixing mount. The elastic positioning assembly protrudes at an end of the fixing mount close to the operating member.

In some embodiments, the input structure further includes a second locking member. The second locking member is inserted into the base. The second locking member is configured to limit an end of the fixing mount mounted with the elastic positioning assembly in the base.

In some embodiments, an end of the fixing mount close to the operating member is provided with a pair of third insertion portions opposite to each other, and the two third insertion portions are respectively arranged on both sides of the fixing mount. The second locking member is provided with two fourth insertion portions opposite to each other, and the two fourth insertion portions correspond to the two third insertion portions in one-to-one correspondence. In response to the second locking member being connected with the fixing mount by insertion, the two third insertion portions are respectively fitted with the fourth insertion portions on corresponding sides thereof in one-to-one correspondence.

In some embodiments, the detection assembly includes a signal generating member and a triggering member, the triggering member moves synchronously with the operating member, and a relative position between the signal generating member and the base is fixed. In response to the triggering member moving, the signal generating member is triggered to generate the corresponding trigger signal.

In some embodiments, the triggering member includes a magnet, and the signal generating member includes a Hall sensor. In response to the triggering member moving, a magnetic flux detected by the signal generating member changes, and the corresponding trigger signal is generated by the signal generating member.

In some embodiments, the signal generating member includes a distance sensor, and the triggering member includes a plurality of sinking grooves. The plurality of sinking grooves have different depths and correspond to the distance sensor. Each of the plurality of sinking grooves includes a groove bottom, and the groove bottom is opposite to the distance sensor. In response to the elastic positioning assembly abutting against one of the positioning portions, one of the plurality of sinking grooves corresponds to the distance sensor, the distance sensor detects the sinking grooves of different depths and generates the corresponding trigger signal.

In some embodiments, the elastic positioning assembly includes an elastic member and a positioning ball. The elastic member is configured to push the positioning ball to move in a direction towards the positioning portion, such that the positioning ball is cling to the positioning portion.

In some embodiments, an assembling space is defined inside the base, and at least one of a front side and a rear side of the assembling space is in communication with the outside.

In some embodiments, one side of the base further defines a first mounting hole. One end of the first mounting hole is in communication with the assembling space, and the other end of the first mounting hole is in communication with the external environment. One end of each of the plurality of positioning portions can pass through the first mounting hole and extends into the assembling space; and the operating member can slide up and down relative to the first mounting hole.

In some embodiments, the assembling space includes a first limiting cavity and a second limiting cavity in communication with the first limiting cavity. The first locking member is inserted into the first limiting cavity.

In some embodiments, a width of the first locking member is equal to a width of the first limiting cavity.

In some embodiments, the operating member further includes an execution portion, and the execution portion is arranged at the end of the operating member away from the positioning portions.

In some embodiments, the at least two positioning portions are grooves, and an arc transition is provided between two adjacent positioning portions.

According to another aspect of the present disclosure, an input structure is provided. The input structure includes: a base defining an assembling space; an operating member at least partially received in the assembling space and movably disposed on one side of the base; an elastic positioning assembly at least partially received in the assembling space and arranged opposite to the operating member, so as to position the operating member; a first locking member arranged in the assembling space and connected with the operating member by insertion; and a detection assembly. At least two positioning portions are arranged on an end surface of the operating member close to the elastic positioning assembly, and the positioning portions cooperate with the elastic positioning assembly to position the operating member. The detection assembly is configured to detect position variation of the operating member and generate a corresponding trigger signal.

According to another aspect of the present disclosure, an electronic device is provided. The electronic device includes an input structure. The input structure: a base, an operating member, an elastic positioning assembly, and a detection assembly. The operating member is movably arranged on one side of the base. The elastic positioning assembly is arranged on another side of the base away from the operating member. At least two positioning portions are arranged on an end surface of the operating member close to the elastic positioning assembly, the positioning portions cooperate with the elastic positioning assembly to position the operating member. The detection assembly is configured to detect position variation of the operating member and generate a corresponding trigger signal.

BRIEF DESCRIPTION OF THE DRAWINGS

In order to more clearly explain the technical solutions of the embodiments of the present disclosure, the following will briefly introduce the drawings needed in the embodiments. It should be understood that the following drawings only show some embodiments of the present disclosure, so they should not be regarded as limiting the scope. For those of ordinary skills in the field, other related drawings may also be obtained from these drawings.

REFERENCE NUMERALS DESCRIPTION

Figure 1:
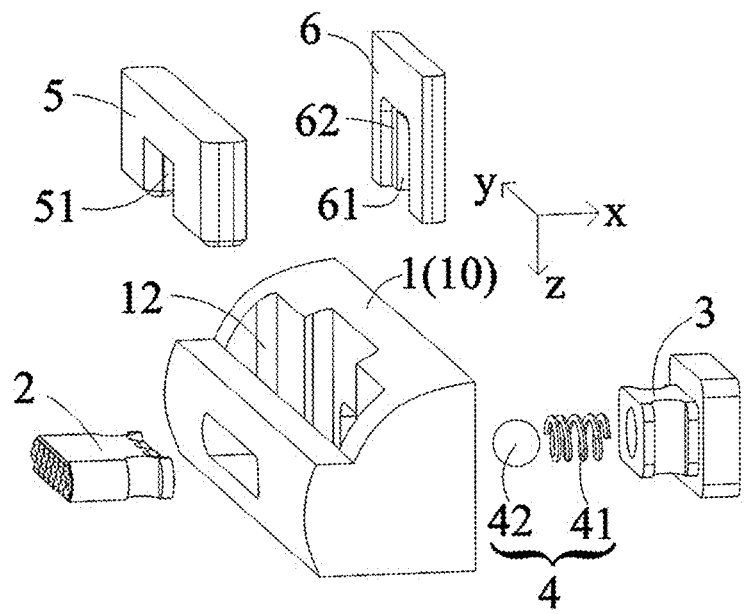
FIG. 1 is an exploded structural schematic view of an input structure according to an embodiment of the present disclosure.

1—base; 10—middle frame; 11—first mounting hole; 12—assembling space; 12a—first limiting cavity; 12b—second limiting cavity; 13—second mounting hole; 13a—first through hole portion; 13b—second through hole portion; 13c—first abutting portion;

2—operating member; 21—positioning portion; 21a—first positioning portion; 21b—second positioning portion; 21c—third positioning portion; 22—first insertion portion; 23—execution portion;

3—fixing mount; 31—accommodating cavity; 32—third insertion part; 33—second abutting portion;

4—elastic positioning assembly; 41—elastic member; 42—positioning ball;

5—first locking member; 51—second insertion portion;

6—second locking member; 61—fourth insertion portion; 62—limiting groove;

7—detection assembly; 71—signal generating member; 72—triggering member;

8—main board.

DETAILED DESCRIPTION

Embodiments of the present disclosure will be described in detail below, and examples of the embodiments will be illustrated in the accompanying drawings. Same or similar reference numbers refer to same or similar elements or elements having same or similar functions throughout. The embodiments described below with reference to the drawings are illustrative and are intended to explain the present disclosure, and cannot be construed as a limitation to the present disclosure.

In the description of the present disclosure, it should be understood that the terms "center", "longitudinal", "transverse", "length", "width", "thickness", "top", "bottom", "front", "back", "left", "right", "vertical", "horizontal", "top", "bottom", "inside", "outside", "clockwise", "counter-clockwise", "axial" the orientation or position relationship indicated by "radial", "circumferential" and the like is based on the orientation or position relationship shown in the figure, which is only for the convenience of describing the application and simplifying the description, rather than indicating or implying that the device or element referred to must have a specific orientation, be constructed and operate in a specific orientation, so it cannot be understood as a limitation to the present disclosure.

In addition, the terms "first" and "second" are only used for descriptive purposes and cannot be understood as indicating or implying relative importance alternatively implicitly indicating the number of technical features indicated. Therefore, the features defined as "first" and "second" can explicitly or implicitly include one or more of the features. In the description of the present disclosure, "multiple" means two or more, unless otherwise specifically defined.

In the present disclosure, unless otherwise specified and defined, the terms "installation", "connection", "connection", "fixed" and other terms should be understood in a broad sense, for example, they can be fixed connection, removable connection, or integrated; it can be mechanical connection or electrical connection; it can be directly connected or indirectly connected through intermediate media. It can be the internal connection of two components or the interaction between two components. For those of ordinary skill in the art, the specific meaning of the above terms in the present disclosure can be understood according to the specific situation.

In the present disclosure, unless otherwise expressly provided and defined, the first feature "above" or "below" the second feature can be the direct contact between the first and second features, or the indirect contact between the first and second features through an intermediate medium. Moreover, the first feature is "above", "above" and "above" the second feature, but the first feature is directly or diagonally above the second feature, or it only means that the horizontal height of the first feature is higher than the second feature. The first feature "below", "below" and "below" the second feature may be the first feature directly or diagonally below the second feature, or it may simply mean that the horizontal height of the first feature is less than the second feature.

As shown in FIG. 1, for the convenience of description and understanding, a cartesian coordinate system is established. A direction shown in an x-axis is defined as a width direction of an input structure, a direction shown in a y-axis is a height direction of the input structure, and a direction shown in a z-axis is a thickness direction of the input structure. It should also be noted that the above definitions should not be understood as a limitation of the present disclosure.

Example 1

In some embodiments, an input structure is provided. The input structure may be applied to a portable electronic device, such as a mobile phone, a tablet PC, a laptop computer, an audio, a MP3 player, a MP4 player, and so on. A user may operate the input structure to adjust or change a working state, a function or a mode of a corresponding electronic device. The above description is only an example of the application of the input structure, and should not be understood as a limitation on the present disclosure.

Figure 12:
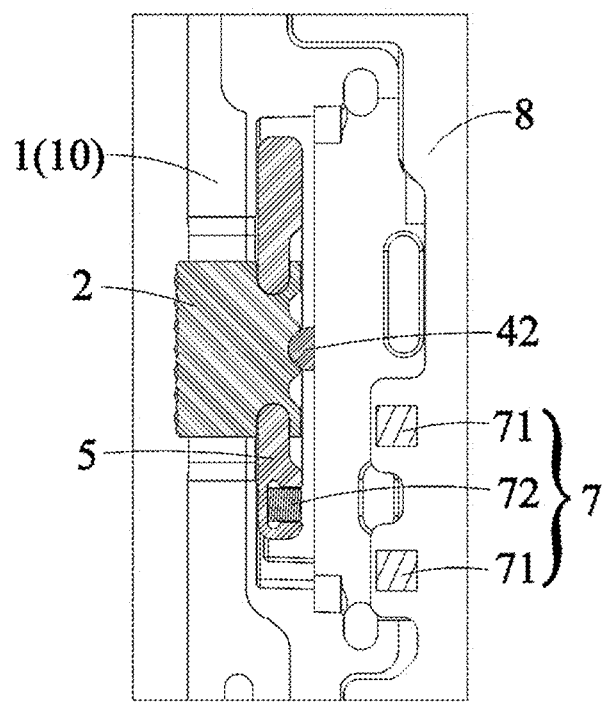
FIG. 12 is a schematic state view of the input structure in a usage state as shown in FIG. 1.

As shown in FIG. 1 and FIG. 12, in some embodiments, the input structure includes a base 1, an operating member 2, an elastic positioning assembly 4, and a detection assembly 7. The operating member 2 is slidably arranged on a side of the base 1. It can be understood that the operating member 2 may move linearly relative to the base 1, thereby changing a position of the operating member 2 relative to the base 1.

The elastic positioning assembly 4 is arranged on another side of the base 1, and the elastic positioning assembly 4 is arranged opposite to the operating member 2. The elastic positioning assembly 4 is configured to position the operating member 2, so as to fix the operating member 2 at a specific position, thereby avoiding random movement of the operating member 2 relative to the base 1.

Figure 2:
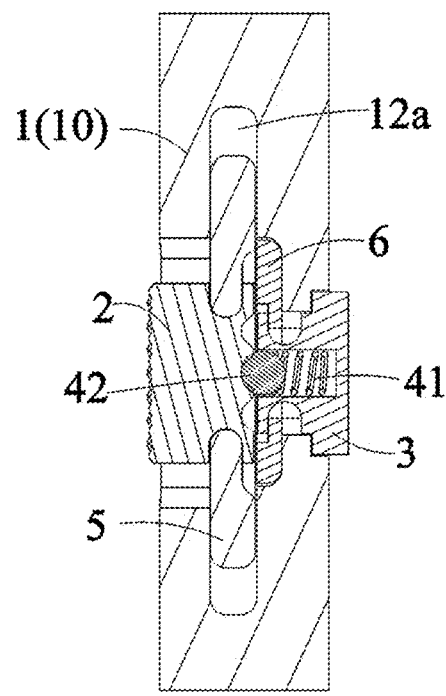
FIG. 2 is a sectional structural schematic view along a x-y plane of the input structure in an assembled state as shown in FIG. 1.
Figure 5:
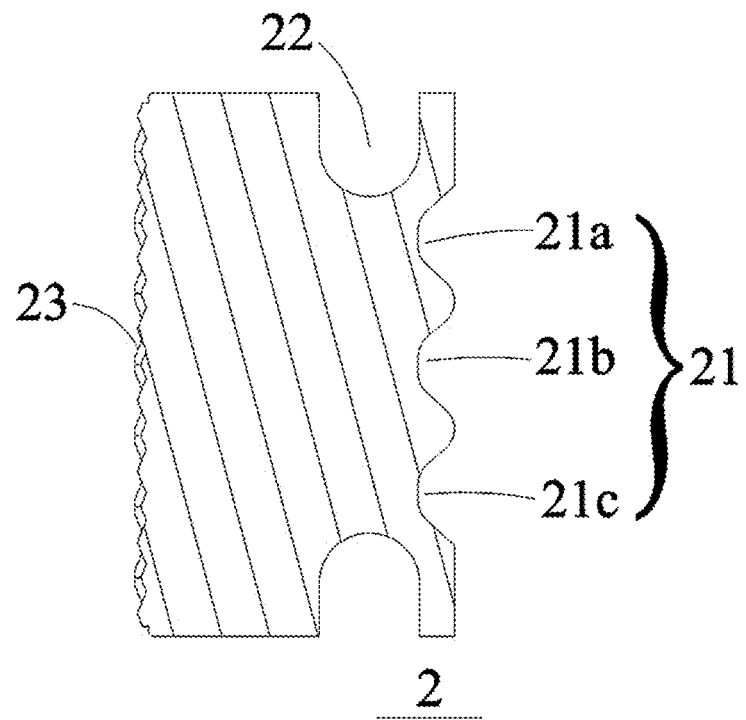
FIG. 5 is a sectional structural schematic view of an operating member along the x-y plane as shown in FIG. 1.
Figure 6:
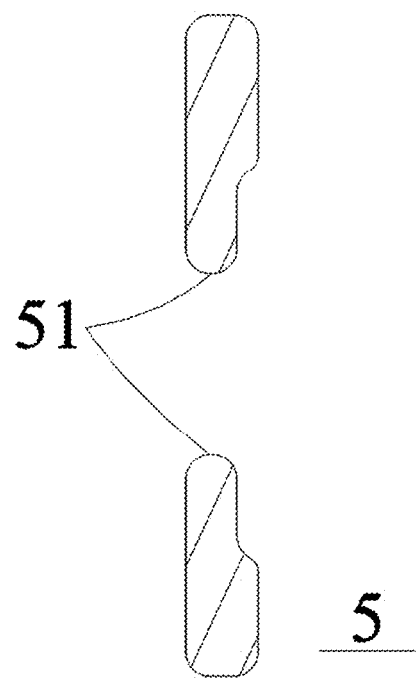
FIG. 6 is a sectional structural schematic view of a first locking member along the x-y plane as shown in FIG. 1.

As shown in FIG. 2 and FIG. 5, at least two positioning portions 21 are arranged at an end of the operating member 2 close to the elastic positioning assembly 4. The positioning portions 21 may be in a concave-groove shape. An end of the elastic positioning assembly 4 may be limited in one of the positioning portions 21. When the elastic positioning assembly 4 is fitted with one of the positioning portions 21, positioning of the operating member 2 may be achieved.

In some embodiments, the positioning portions 21 may be arranged along any one of straight-line directions on a y-z plane. The operating member 2 is arranged correspondingly along the straight line relative to a sliding direction of the base 1. On the y-z plane, the position of the elastic positioning assembly 4 relative to the base 1 remains unchanged. When the operating member 2 slides relative to the base 1, the elastic positioning assembly 4 may switch from one of the positioning portions 21 to another adjacent positioning portion 21, thereby positioning the operating member 2.

In some embodiments, the detection assembly 7 is configured to detect position variation of the operating member 2 and generate a corresponding trigger signal. It should be understood that when the operating member 2 is in different positions, the detection assembly 7 may generate different trigger signals.

In use, the detection assembly 7 may be connected to a main control unit of the electronic device. A connection between the detection assembly 7 and the main control unit may be realized through wired communication, wireless communication, or other forms, so as to send the trigger signal to the main control unit. The user may push the operating member 2 to slide, such that the position of the entire operating member 2 relative to the base 1 may be changed. According to detected position variation information, the detection assembly 7 may generate a corresponding trigger signal and send the corresponding trigger signal to the main control unit. According to a received trigger signal, the main control unit may control the electronic device to switch a corresponding working state, mode, function, or the like.

In some embodiments, the number of the positioning portion 21 may be designed as requirements of the electronic device, such as two, three, four, or other numbers, which is not limited herein.

In other embodiments, the operating member 2 may be rotatably arranged on one side of the base 1, and a rotation axis of the operating member 2 may be a central axis of the operating member 2. Accordingly, on the y-z plane, the positioning portions 21 are arranged in a circular shape around the central axis of the operating member 2. The elastic positioning assembly 4 may be arranged close to an edge of the operating member 2, and corresponding to the positioning portions 21. In use, the user rotates the operating member 2 to make the operating member 2 change a position relative to the base 1 in a circumferential direction. The elastic positioning assembly 4 may perform switching and positioning in the positioning portions 21. At the same time, position variation of a part of the operating member 2 may be detected by the detection assembly 7, so as to generate a corresponding trigger signal.

In other embodiments, the operating member 2 is rotatably arranged on the base 1, and the rotation axis of the operating member 2 is set at an eccentric position of the operating member 2. A plurality of positioning portions 21 are arranged correspondingly on an end surface of the operating member 2 close to the elastic positioning assembly 4 around the rotation axis. The plurality of positioning portions 21 are arranged in an annular manner. The elastic positioning assembly 4 may be arranged close to the edge of the operating member 2, and corresponding to the positioning portions 21. In use, the user rotates the operating member 2 to change the position of the operating member 2 relative to the base 1, and the elastic positioning assembly 4 may perform switching and positioning in the positioning portions 21. At the same time, position variation of the operating member 2 may be detected by the detection assembly 7, so as to generate a corresponding trigger signal.

It can be seen that when the electronic device includes a plurality of functions, modes or working states, the number of the positioning portions 21 may be designed correspondingly on the operating member 2 as required. Therefore, it is possible to meet the needs of multi-function switching, multi-mode switching or multi-working-state switching in a case that it is not necessary to arrange a large number of keys. In this way, it is possible to reduce the occupation of the internal space in the electronic device, thereby simplifying an internal structure and avoiding the impact on an external form of electronic device. At the same time, in the embodiments of the present disclosure, the input structure has a simple structure and a short size chain, and thus it is convenient to assemble, resulting in low cost and high reliability.

Example 2

In some embodiments, an input structure is provided, and may be applied to a mobile phone. It can be understood that this embodiment is a further improvement based on the first embodiment.

In some embodiments, the input structure is arranged on a side of the mobile phone, and the base 1 may be a part of a middle frame 10. A detailed description as follow is taken as an example that the operating member 2 slides up and down along the y-axis.

As shown in FIGS. 1-2, an assembling space 12 is defined inside the middle frame 10, and at least one of a front side and a rear side of the assembling space 12 is in communication with the outside. In this embodiment, the rear side of the assembling space 12 is in communication with the outside. Specifically, as shown in FIG. 2, a side close to the outside of a paper may be in communication with the outside.

Figure 3:
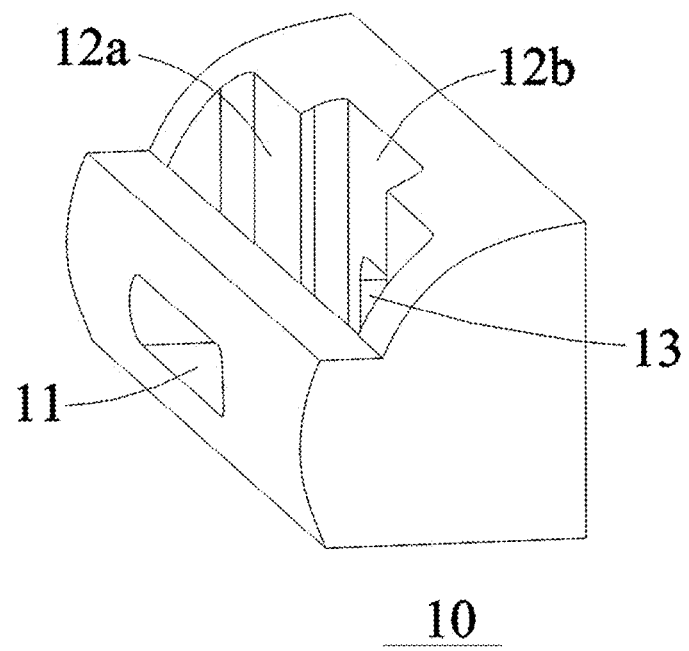
FIG. 3 is a structural schematic view of a base as shown in FIG. 1.
Figure 4:
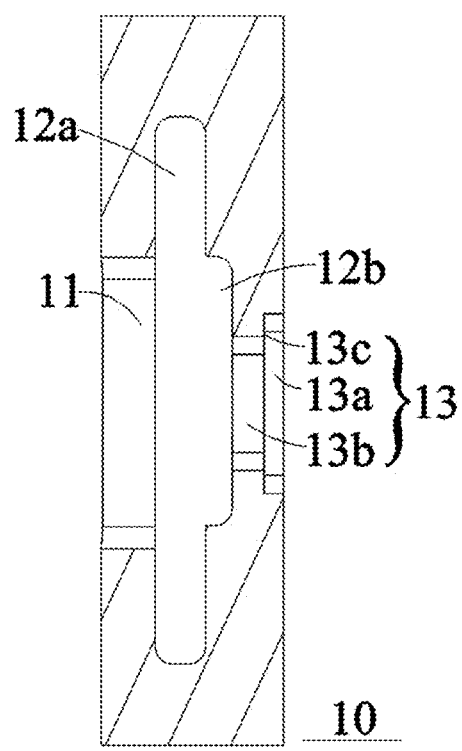
FIG. 4 is a sectional structural schematic view of the base along the x-y plane as shown in FIG. 3.

As shown in FIGS. 2-4, a side of the middle frame 10 defines a first mounting hole 11. One end of the first mounting hole 11 is in communication with the assembling space 12, and the other end of the first mounting hole 11 is in communication with the external environment. The first mounting hole 11 may be a long strip-shaped through hole extending along a height direction of the middle frame 10. The end of the operating member 2 provided with the positioning portions 21 passes through the first mounting hole 11 and extends into the assembling space 12, and the operating member 2 may slide up and down relative to the first mounting hole 11.

In some embodiments, the assembling space 12 includes a first limiting cavity 12a and a second limiting cavity 12b, and the first limiting cavity 12a is in communication with the second limiting cavity 12b. In the width direction of the input structure, the first limiting cavity 12a is arranged closer to the operating member 2 than the second limiting cavity 12b. The positioning portions 21 of the operating member 2 are disposed in the first limiting cavity 12a.

As shown in FIG. 2 and FIG. 5, the operating member 2 further includes an execution portion 23. The execution portion 23 is arranged at an end of the operating member 2 away from the positioning portions 21. The execution portion 23 is disposed outside of the middle frame 10, that is, the execution portion 23 is disposed on a side of the first mounting hole 11 away from the assembling space 12, and the execution portion 23 is exposed to the outside, such that the user may touch the execution portion 23 to perform related operations. In use, the user may operate the execution portion 23 to push the operating member 2 to slide up and down.

In some embodiments, the execution portion 23 is provided with a slip-resistant pattern, such that the user may operate conveniently, thereby avoiding slipping.

As shown in FIG. 1 and FIGS. 2 to 6, the input structure further includes a first locking member 5. The first locking member 5 is inserted into the first limiting cavity 12a. At the same time, the first locking member 5 is connected with the operating member 2 by insertion, such that an end of the operating member 2 is limited in the middle frame 10 to realize the assembly of the operating member 2.

Specifically, two first insertion portions 22 opposite to each other are arranged on an end of the operating member 2 close to the positioning portion 21. The two first insertion portions 22 are respectively arranged on an upper side and a lower side of the operating member 2. The two first insertion portions 22 may be symmetrically arranged.

The first locking member 5 has a U-shaped structure. Two second insertion portions 51 opposite to each other are arranged on an inner wall of the first locking member 5. The two second insertion portions 51 are symmetrically arranged. The two second insertion portions 51 correspond to the two first insertion portions 22 in one-to-one correspondence. When the first locking member 5 is connected with the operating member 2 by insertion, the second insertion portions 51 are fitted with the first insertion portion 22 in one-to-one correspondence.

In some embodiments, the first insertion portion 22 is a recess. Accordingly, the second insertion portions 51 is a protrusion engaged with the recess. When the first insertion portion 22 is fitted with the second insertion portion 51, the second insertion portion 51 is embedded in the first insertion portion 22.

In other embodiments, the first inserting portion 22 is a protrusion. Accordingly, the second insertion portion 51 is a recess engaged with the protrusion. When the first insertion portion 22 is fitted with the second insertion portion 51, the first insertion portion 22 is embedded in the second insertion portion 51.

As shown in FIG. 2, a width of the first locking member 5 is substantially equal to that of the first limiting cavity 12a, such that movement of the first locking member 5 may be limited within the first limiting cavity 12a in the width direction of the input structure, thereby avoiding a case that the user is unable to touch the execution portion 23 of the operating member 2. A height of the first locking member 5 is less than that of the first limiting cavity 12a, such that the first locking member 5 may slide up and down in the first limiting cavity 12a. At the same time, a cross section of the first locking member 5 is larger than that of the first mounting hole 11, so as to limit the first locking member 5 to be disposed in the first limiting cavity 12a, thereby limiting an end of the operating member 2 provided with the positioning portion 21 to be disposed in the first limiting cavity 12a. The cross section of the first locking member 5 and the cross section of the first mounting hole 11 are taken along the y-z plane.

A height of the operating member 2 is less than that of the first mounting hole 11, and a thickness of the operating member 2 may be substantially equal to that of the first mounting hole 11. At the same time, a movable stroke of the first locking member 5 in the first limiting cavity 12a may be substantially equal to a movable stroke of the operating member 2 in the first mounting hole 11.

During assembly, an end of the operating member 2 provided with the positioning portions 21 passes through the first mounting hole 11 and extends into the first limiting cavity 12a. Thereafter, the first locking member 5 is inserted into a side of the assembling space 12 in communication with the outside. The second insertion portions 51 of the first locking member 5 are plugged in the first insertion portions 22 of the operating member 2 in one-to-one correspondence, such that the first locking member 5 is connected with the operating member 2 by insertion. In this way, the operating member 2 may be assembled on the middle frame 10, thereby making the assembly extremely convenient.

Further, as shown in FIGS. 2-4, the elastic positioning assembly 4 is arranged on a side of the middle frame 10 via a fixing mount 3. Specifically, one side of the middle frame 10 away from the first mounting hole 11 defines a second mounting hole 13. The second mounting hole 13 is in communication with the second limiting cavity 12b. The fixing mount 3 is arranged on the second mounting hole 13, and an end of the fixing mount 3 extends into the second limiting cavity 12b. The elastic positioning assembly 4 is arranged on an end of the fixing mount 3 close to the second limiting cavity 12b.

In some embodiments, an end of the fixing mount 3 mounted with the elastic positioning assembly 4 is limited in the second limiting cavity 12b via the second locking member 6, such that the fixing mount 3 may be arranged on the middle frame 10.

As shown in FIG. 2 and FIG. 4, the second mounting hole 13 is a step hole. The second mounting hole 13 includes a first through hole portion 13a and a second through hole portion 13b. The first through hole portion 13a is in communication with the second through hole portion 13b. The second through hole portion 13b is arranged close to the second limiting cavity 12b, and a cross section of the second through hole portion 13b is smaller than that of the first through hole portion 13a, such that a first abutting portion 13c is formed at a connection between the first through hole portion 13a and the second through hole portion 13b. The first abutting portion 13c is configured to limit the fixing mount 3. The cross section of the first through hole portion 13a and the cross section of the second through hole portion 13b are taken along the y-z plane.

Figure 7:
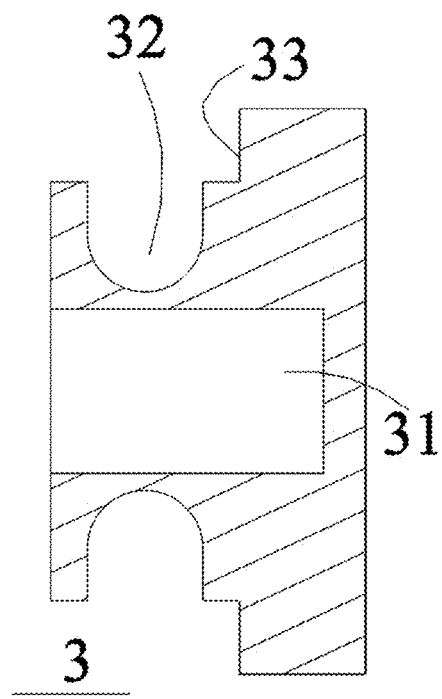
FIG. 7 is a sectional structural schematic view of a fixing mount along the x-y plane as shown in FIG. 1.

As shown in FIG. 2 and FIG. 7, one side of the fixing mount 3 away from the second limiting cavity 12b is provided with a second abutting portion 33. The second abutting portion 33 abuts against the first abutting portion 13c, such that the fixing mount 3 may be limited in one direction of the width direction. The second locking member 6 is inserted in the second limiting cavity 12b, and the second locking member 6 is connected with the fixing mount 3 by insertion, such that the fixing mount 3 may be limited in another direction of the width direction. In this way, the fixing mount 3 is fixedly installed on the middle frame 10.

Figure 8:
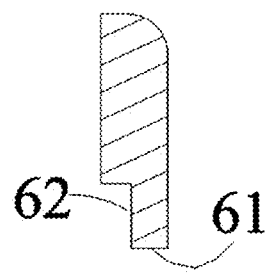
FIG. 8 is a sectional structural schematic view of a second locking member along the x-y plane as shown in FIG. 1.
Figure 8:
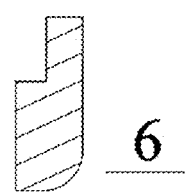

As shown in FIG. 2 and FIGS. 7-8, two third insertion portions 32 opposite to each other are arranged at an end of the fixing mount 3 close to the second limiting cavity 12b. The two third insertion portions 32 are respectively arranged on an upper side and a lower side of the fixing mount 3, and the two third insertion portions 32 may be symmetrically arranged.

In some embodiments, the second locking member 6 may also be a U-shaped structure. Each of two inner walls of the second locking member 6 is provided with a fourth insertion portion 61. The two fourth insertion portion 61 may also be symmetrically arranged. The two fourth insertion portions 61 correspond to the two third insertion portions 32 in one-to-one correspondence. When the second locking member 6 is connected with the fixing mount 3 by insertion, the two fourth insertion portions 61 are respectively fitted with the third insertion portions 32 on corresponding sides thereof.

In some embodiments, the third insertion portion 32 is a recess. Accordingly, the fourth insertion portion 61 is a protrusion. When the third insertion portion 32 is fitted with the fourth insertion portion 61, the fourth insertion portion 61 is embedded in the third insertion portion 32.

In other embodiments, the third insertion portion 32 is a protrusion. Accordingly, the fourth insertion portion 61 is a recess. When the third insertion portion 32 is fitted with the fourth insertion portion 61, the third insertion portion 32 is embedded in the fourth insertion portion 61.

As shown in FIG. 2 and FIG. 8, a height of the second locking member 6 is substantially equal to that of the second limiting cavity 12b, and the second locking member 6 is cling to the first locking member 5, so as to prevent the second locking member 6 from moving in the second limiting cavity 12b. A cross section of the second locking member 6 is larger than that of an end of the second mounting hole 13 close to the second limiting cavity 12b, such that the second locking member 6 is limited in the second limiting cavity 12b, and it is possible to ensure that the end of the fixing mount 3 is limited in the second limiting cavity 12b. A side of the second locking member 6 close to the second limiting cavity 12b defines a limiting groove 62. The limiting groove 62 is configured to embed an end of the fixing mount 3, so as to prevent the end of the fixing mount 3 from interfering with the sliding of the operating member 2 and the first locking member 5. The cross section of the second locking member 6 and the cross section of the second mounting hole 13 are taken along the y-z plane.

During installation, an end of the fixing mount 3 passes through the second mounting hole 13 and enters into the second limiting cavity 12b, such that the second abutting portion 33 abuts against the first abutting portion 13c. Thereafter, the second locking member 6 is inserted from the side of an opening of the assembling space 12, such that the fourth insertion portion 61 is inserted correspondingly to the third insertion portion 32, and the second locking member 6 is connected with the fixing mount 3 by insertion. At the same time, an end of the fixing mount 3 close to an end of the second limiting cavity 12b is limited in the limiting groove 62. In this way, the fixing mount 3 is fixedly installed on the middle frame 10.

As shown in FIGS. 1, 2, and 7, an accommodating cavity 31 is defined inside the fixing mount 3, and the accommodating cavity 31 is in communication with the assembling space 12. The elastic positioning assembly 4 is limited and arranged in the accommodating cavity 31. An end of the elastic positioning assembly 4 protrudes out of the accommodating cavity 31 and extends into the assembling space 12, such that the elastic positioning assembly 4 abuts against the positioning portion 21.

In some embodiments, the elastic positioning assembly 4 includes an elastic member 41 and a positioning ball 42. The elastic member 41 is embedded in the accommodating cavity 31. At least part of the positioning ball 42 is disposed in the accommodating cavity 31, thereby preventing the positioning ball 42 from detaching the fixing mount 3. At the same time, at least part of the positioning ball 42 protrudes out of the accommodating cavity 31, such that the positioning ball 42 may abut against the positioning portion 21. One end of the elastic member 41 abuts against a bottom of the accommodating cavity 31, that is, an end of the accommodating cavity 31 away from the second limiting cavity 12b. The other end of the elastic member 41 abuts against the positioning ball 42. The elastic member 41 is compressed between the positioning ball 42 and the bottom of the accommodating cavity 31, such that the elastic member 41 pushes the positioning ball 42 to move in a direction towards the positioning portion 21.

An outer diameter of the elastic positioning assembly 4 is equal to or slightly less than an inner diameter of the accommodating cavity 31, thereby guiding the elastic positioning assembly 4 and avoiding deviation of the elastic positioning assembly 4. In this way, it is possible to ensure that the elastic positioning assembly 4 performs a stable and reliable elastic expansion.

In some embodiments, the elastic member 41 may be selected from one or more combinations of an elastic assembly, such as a spring, a flexible block, a spring plate, etc.

In some embodiments, the positioning ball 42 may be a ball, an elastic ball, or the like. Of course, the positioning ball 42 may also be a solid ball or a hollow ball.

In other embodiments, the elastic positioning assembly 4 may further include a sleeve (not shown). The elastic member 41 and the positioning ball 42 are arranged in the sleeve, such that the elastic positioning assembly 4 forms a complete spring needle structure, thereby facilitating the entire installation. The sleeve may be fixedly arranged in the accommodating cavity 31. Specifically, the sleeve may be connected to the accommodating cavity 31 by means of thread connection, interference fit, or the like.

When the operating member 2 slides relative to the middle frame 10, the positioning ball 42 may move from one of the positioning portions 21 to another adjacent positioning portion 21. In some embodiments, each of the positioning portions 21 may be selected from a spherical recess, and an arc transition may also be selected between two adjacent positioning portions 21. Therefore, the positioning ball 42 may smoothly move from one of the positioning portions 21 to another adjacent positioning portion 21, thereby avoiding the problem of jamming.

Figure 9:
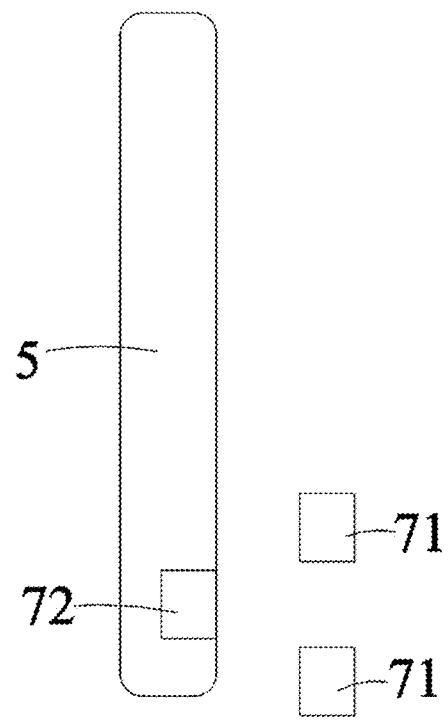
FIG. 9 is a structural schematic view of a detection assembly according to an embodiment of the present disclosure.

As shown in FIGS. 9 and 12, the detection assembly 7 includes a signal generating member 71 and a triggering member 72. The triggering member 72 is configured to trigger the signal generating member 71 to generate a corresponding trigger signal. The signal generating member 71 is fixedly arranged relative to the middle frame 10. The triggering member 72 moves synchronously with the operating member 2. Therefore, when the operating member 2 slides relative to the middle frame 10, the triggering member 72 may synchronously move relative to the signal generating member 71.

In some embodiments, the signal generating member 71 may be fixedly arranged on a main board 8 of the mobile phone and connected with a main control unit of the main board 8. The signal generating member 71 is arranged close to the input structure, such that the triggering member 72 may act on the signal generating member 71.

Of course, in other embodiments, the signal generating member 71 may also be directly arranged on the middle frame 10.

In some embodiments, the triggering member 72 may be fixedly arranged at an end of the first locking member 5, such that the triggering member 72 may move synchronously with the operating member 2. The triggering member 72 is arranged at an end of the first locking member 5 close to the signal generating member 71.

In other embodiments, the triggering member 72 may also be directly arranged at an end of the operating member 2 close to the fixing mount 3.

In some embodiments, the triggering member 72 may be a magnet. Correspondingly, the signal generating member 71 may be a Hall sensor. When the triggering member 72 moves relative to the signal generating member 71, magnetic fields around the signal generating member 71 may change, and thus a magnetic flux detected by the signal generating member 71 may change. In this way, the signal generating member 71 may generate a corresponding triggering signal and send the corresponding triggering signal to the main control unit. In the embodiment, two signal generating members 71 may be arranged in a moving direction of the triggering member 72. The two signal generating members 71 may cooperate with each other to improve the detection accuracy and sensitivity.

Of course, in other embodiments, the number of the signal generating members 71 may also be designed as requirements, such as one, three, four, or the like, which is not limited herein.

Figure 10:
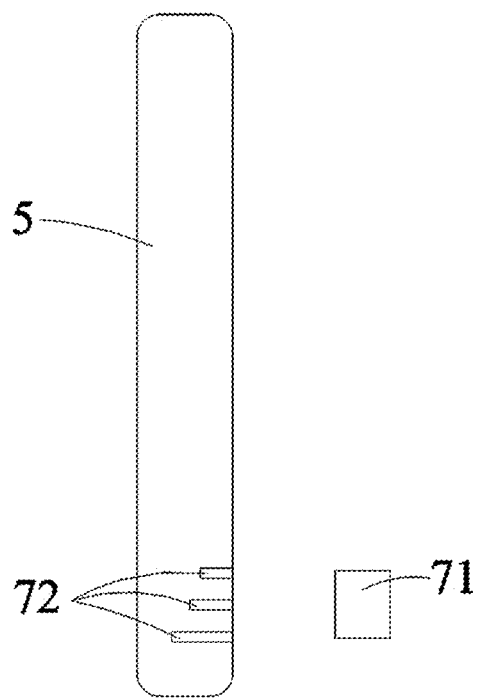
FIG. 10 is a structural schematic view of a detection assembly according to another embodiment of the present disclosure.

As shown in FIG. 10, in other embodiments, the signal generating member 71 may also be selected from a distance sensor. Correspondingly, the triggering member 72 may include a plurality of sinking grooves with different depths, and a bottom of each of the plurality of sinking grooves is opposite to the signal generating member 71. The number of the plurality of sinking grooves is equal to the number of the positioning portions 21. The plurality of sinking grooves correspond to the positioning portions 21 in one-to-one correspondence. When the elastic positioning assembly 4 abuts against one of the positioning portions 21, one of the sinking grooves correspond to the signal generating member 71. Therefore, the sinking grooves of different depths may be detected by the signal generating member 71, so as to determine a moving position of the operating member 2, and thus the corresponding trigger signal may be generated by the signal generating member 71.

Figure 13:
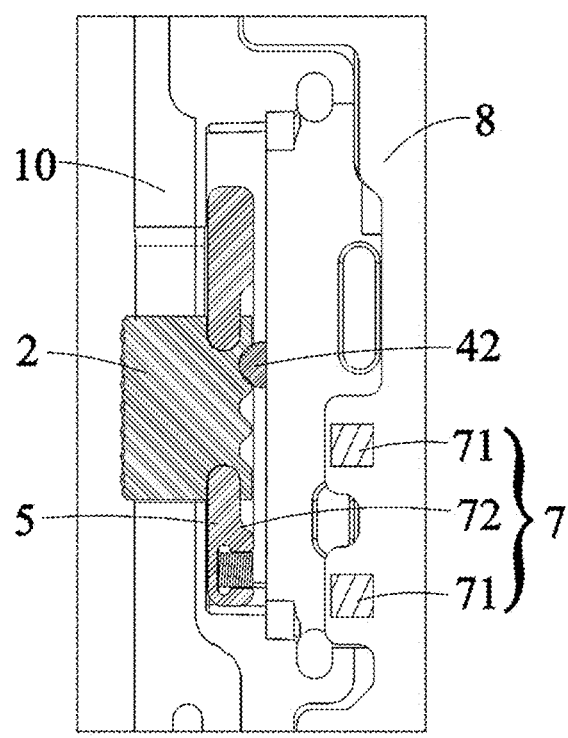
FIG. 13 is another schematic state view of the input structure in a usage state as shown in FIG. 1.

As shown in FIGS. 12-13, in use, the user pushes the operating member 2 to move, such that the operating member 2 is in different positions. During this process, the elastic positioning assembly 4 may be squeezed by the operating member 2, such that the elastic positioning assembly 4 has a round-trip stroke in the width direction of the input structure, and thus the elastic positioning assembly 4 may move from one of the positioning portions 21 to another one of the positioning portions 21. At the same time, the triggering member 72 may also move relative to the signal generating member 71, such that a signal detected by the signal generating member 71 may change, and thus the signal generating member 71 may generate a corresponding trigger signal and send the corresponding trigger signal to the main control unit. Thereafter, the mobile phone may be controlled by the main control unit to switch the corresponding functions, working modes, etc.

When the user pushes the operating member 2 to move, it is necessary to overcome an elastic force of the elastic member 41 to do work, such that a hand feeling of the user during the operation may be increased, thereby facilitating the user to identify the operation action.

The operating member 2 may be positioned by the elastic positioning assembly 4. The operating member 2 may be kept at the same position in the case that there is no external force on the operating member 2. At the same time, the signal generating member 71 may also send a stable trigger signal to the main control unit, such that the mobile phone may maintain in a corresponding working mode, function, or state, thereby improving the reliability of the input structure.

In some embodiments, the operating member 2 is provided with three positioning portions 21. The three positioning portions 21 include a first positioning portion 21a, a second positioning portion 21b, and a third positioning portion 21c, such that the input structure forms a three-stage input structure. The first positioning portion 21a, the second positioning portion 21b, and the third positioning portion 21c are arranged sequentially from top to bottom. The first positioning portion 21a, the second positioning portion 21b, and the third positioning portion 21c may respectively correspond to a mute mode, a vibration mode and a ringing mode of a reminder mode of the mobile phone. In use, the user pushes the operating member 2 to make the elastic positioning assembly 4 abut against different positioning portions 21, such that the operating member 2 is fixed at a corresponding position. The detection assembly 7 sends a corresponding trigger signal to the main control unit according to the position of the operating member 2, and then the main control unit controls the mobile phone to switch to the mute mode, the vibration mode, or the ringing mode.

In some embodiments, the first positioning portion 21a is corresponding to the mute mode, the second positioning portion 21b is corresponding to the vibration mode, and the third positioning portion 21c is corresponding to the ringing mode.

For example, an initial state of the input structure is the ringing mode, and the elastic positioning assembly 4 abuts against the third positioning portion 21c accordingly. When it is necessary to adjust the reminder mode of the mobile phone to the vibration mode, the operating member 2 may be pushed up relative to the middle frame 10. During this process, the elastic positioning assembly 4 is squeezed by the operating member 2, such that the elastic positioning assembly 4 is embedded in the fixing mount 3. When the second positioning portion 21b corresponds to the elastic positioning assembly 4, the elastic positioning assembly 4 resets and abuts against the second positioning portion 21b. At this time, position variation of the operating member 2 is detected by the detection assembly 7, a corresponding trigger signal is sent to the main control unit of the mobile phone, and thus the mobile phone is controlled by the main control unit to switch to the vibration mode according to the received trigger signal.

In other embodiments, the input structure may also be configured to switch the functional modes, such as brightness adjustment of a mobile phone screen, volume adjustment, and so on, which is not limited herein.

In some embodiments, during assembly, an end of the operating member 2 provided with the positioning portions 21 may be inserted into the assembling space 12 of the middle frame 10, and then the first locking member 5 may be inserted into the assembling space 12. At the same time, the first locking member 5 is connected with the operating member 2 by insertion, such that an end of the operating member 2 provided with the positioning portions 21 may be limited into the middle frame 10. Thereafter, the elastic positioning assembly 4 may be installed in the fixing mount 3, and an end of the fixing mount 3 provided with the elastic positioning assembly 4 may be inserted into the assembling space 12 of the middle frame 10. The second locking member 6 is inserted, such that the second locking member 6 is connected with the fixing mount 3 by insertion, and thus the assembly of the input structure is completed.

In other embodiments, the fixing mount 3 provided with the elastic positioning assembly 4 and the second locking member 6 may be firstly assembled into the middle frame 10, and then the operating member 2 and the first locking member 5 may be assembled into the middle frame 10.

Therefore, the input structure according to the embodiments of the present disclosure has a simple structure, a short dimension chain, a low cost, and a high reliability, and it is convenient to assemble. At the same time, it is not necessary to arrange a complex key structure, and the numbers of the positioning portions 21 may be designed differently to meet the switching of different numbers of functions, modes, or working states, thereby improving the user experience.

Example 3

Figure 11:
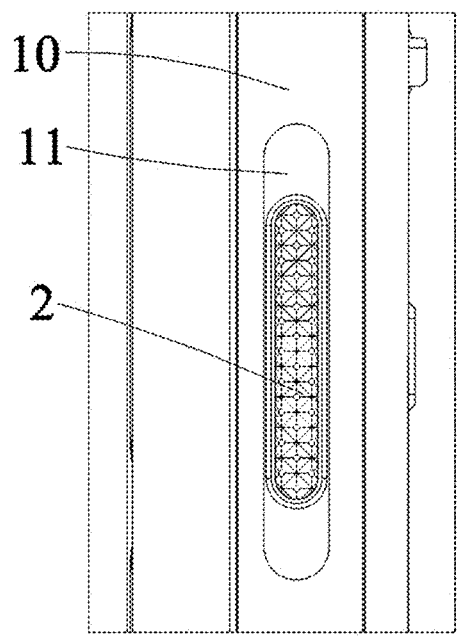
FIG. 11 is an external structural schematic view of the input structure in an installed state as shown in FIG. 1.

As shown in FIGS. 11-13, according to the present disclosure, an electronic device is provided. The electronic device includes the input structure provided in the Example 1 or the Example 2.

In the embodiment, the electronic device may be a mobile phone.

In other embodiments, the electronic device may also be the tablet PC, the laptop computer, the audio, the MP3 player, the MP4 player, or other devices.

The base 1 is a part of the middle frame 10 of the electronic device, and the execution portion 23 of the operating member 2 is disposed outside the electronic device, thereby facilitating the user to perform relevant operations. The signal generating member 71 of the detection assembly 7 may be directly arranged on the main board 8 of the electronic device. The signal generating member 71 is electrically connected with the main control unit of the electronic device.

In use, the user may switch the working state, the mode, or the function of the electronic device and other matters via the operating member 2.

In the description of this specification, reference to the description of the terms "one embodiment", "some embodiments", "examples", "specific examples", or "some examples" means that the specific features, structures, materials alternatively described in combination with the embodiment or examples are included in at least one embodiment or example of The present disclosure. In this specification, the illustrative expression of the above terms is not limited to refer to the same embodiments or examples.

Moreover, in any one or more embodiments or examples, the specific features, structures, materials, or features described may be combined in an appropriate manner. In addition, those skilled in the art can combine different embodiments or examples described in this specification and the characteristics of different embodiments or examples without contradiction.

Although the embodiments of the present disclosure have been shown and described above, it is it would be considered by one skilled in the art that the above embodiments are exemplary and cannot be understood as restrictions on the present disclosure. Those skilled in the art can change, modify, replace, and modify the above embodiments within the scope of the present disclosure.

What is claimed is:

1. An input structure, comprising:
a base, an operating member, an elastic positioning assembly, a detection assembly, and a first locking member;
wherein the operating member is movably arranged on one side of the base;
the elastic positioning assembly is arranged on another side of the base away from the operating member;
at least two positioning portions are arranged on an end surface of the operating member close to the elastic positioning assembly, the positioning portions cooperate with the elastic positioning assembly to position the operating member;
the detection assembly is configured to detect position variation of the operating member and generate a corresponding trigger signal; and
wherein the first locking member is inserted into the base and connected with the operating member by insertion and is configured to limit an end of the operating member provided with the positioning portions in the base.

2. The input structure according to claim 1, wherein the at least two positioning portions are arranged in a straight line on the end surface of the operating member; and
in response to the operating member sliding relative to the base, the elastic positioning assembly generates elastic deformation and moves from one of the positioning portions to another one of the positioning portions.

3. The input structure according to claim 1, wherein a plurality of positioning portions are arranged in a circular shape around a central axis of the operating member; and
in response to the operating member rotating relative to the base, the elastic positioning assembly generates elastic deformation and moves from one of the positioning portions to another one of the positioning portions.

4. The input structure according to claim 1, wherein an end of the operating member close to the positioning portions is further provided with a pair of first insertion portions opposite to each other, and the two first insertion portions are respectively arranged on both sides of the operating member;
the first locking member is provided with two second insertion portions opposite to each other, and the two second insertion portions correspond to the two first insertion portions in one-to-one correspondence; and
in response to the first locking member being connected with the operating member by insertion, the two first insertion portions are respectively fitted with the second insertion portions on corresponding sides thereof in one-to-one correspondence.

5. The input structure according to claim 1, further comprising: a fixing mount;
wherein the fixing mount is arranged on one side of the base away from the operating member;
the elastic positioning assembly is disposed in the fixing mount; and
the elastic positioning assembly protrudes at an end of the fixing mount close to the operating member.

6. The input structure according to claim 5, further comprising: a second locking member;
wherein the second locking member is inserted into the base; and
the second locking member is configured to limit an end of the fixing mount mounted with the elastic positioning assembly in the base.

7. The input structure according to claim 6, wherein an end of the fixing mount close to the operating member is provided with a pair of third insertion portions opposite to each other, and the two third insertion portions are respectively arranged on both sides of the fixing mount;
the second locking member is provided with two fourth insertion portions opposite to each other, and the two fourth insertion portions correspond to the two third insertion portions in one-to-one correspondence; and
in response to the second locking member being connected with the fixing mount by insertion, the two third insertion portions are respectively fitted with the fourth insertion portions on corresponding sides thereof in one-to-one correspondence.

8. The input structure according to claim 1, wherein the detection assembly comprises a signal generating member and a triggering member, the triggering member moves synchronously with the operating member, and a relative position between the signal generating member and the base is fixed; and
in response to the triggering member moving, the signal generating member is triggered to generate the corresponding trigger signal.

9. The input structure according to claim 8, wherein the triggering member comprises a magnet, and the signal generating member comprises a Hall sensor; and
in response to the triggering member moving, a magnetic flux detected by the signal generating member changes, and the corresponding trigger signal is generated by the signal generating member.

10. The input structure according to claim 8, wherein the signal generating member comprises a distance sensor, and the triggering member comprises a plurality of sinking grooves;
the plurality of sinking grooves have different depths and correspond to the distance sensor;
each of the plurality of sinking grooves comprises a groove bottom, and the groove bottom is opposite to the distance sensor; and
in response to the elastic positioning assembly abutting against one of the positioning portions, one of the plurality of sinking grooves corresponds to the distance sensor, the distance sensor detects the sinking grooves of different depths and generates the corresponding trigger signal.

11. The input structure according to claim 1, wherein the elastic positioning assembly comprises an elastic member and a positioning ball; and
the elastic member is configured to push the positioning ball to move in a direction towards the positioning portion, such that the positioning ball is cling to the positioning portion.

12. The input structure according to claim 1, wherein an assembling space is defined inside the base, and at least one of a front side and a rear side of the assembling space is in communication with the outside.

13. The input structure according to claim 12, wherein one side of the base further defines a first mounting hole;
one end of the first mounting hole is in communication with the assembling space, and the other end of the first mounting hole is in communication with the external environment;
one end of each of the plurality of positioning portions can pass through the first mounting hole and extends into the assembling space; and
the operating member can slide up and down relative to the first mounting hole.

14. The input structure according to claim 12, wherein the assembling space comprises a first limiting cavity and a second limiting cavity, in communication with the first limiting cavity; and
the first locking member is inserted into the first limiting cavity.

15. The input structure according to claim 14, wherein a width of the first locking member is equal to a width of the first limiting cavity.

16. The input structure according to claim 1, wherein the operating member further comprises an execution portion, and the execution portion is arranged at the end of the operating member away from the positioning portions.

17. The input structure according to claim 11, wherein the at least two positioning portions are grooves, and an arc transition is provided between two adjacent positioning portions.

18. An input structure, comprising:
a base defining an assembling space;
an operating member at least partially received in the assembling space and movably disposed on one side of the base;
an elastic positioning assembly at least partially received in the assembling space and arranged opposite to the operating member, so as to position the operating member;
a first locking member arranged in the assembling space and connected with the operating member by insertion; and
a detection assembly;
wherein at least two positioning portions are arranged on an end surface of the operating member close to the elastic positioning assembly, and the positioning portions cooperate with the elastic positioning assembly to position the operating member;
the detection assembly is configured to detect position variation of the operating member and generate a corresponding trigger signal.

19. An electronic device, comprising: an input structure; wherein the input structure comprises:
a base, an operating member, an elastic positioning assembly, a detection assembly, and a first locking member;
wherein the operating member is movably arranged on one side of the base;
the elastic positioning assembly is arranged on another side of the base away from the operating member;
at least two positioning portions are arranged on an end surface of the operating member close to the elastic positioning assembly, the positioning portions cooperate with the elastic positioning assembly to position the operating member;
the detection assembly is configured to detect position variation of the operating member and generate a corresponding trigger signal; and
wherein the first locking member is inserted into the base and connected with the operating member by insertion.

* * * * *